(12) United States Patent
Tuan

(10) Patent No.: US 9,355,690 B1
(45) Date of Patent: May 31, 2016

(54) TIME-MULTIPLEXED, ASYNCHRONOUS DEVICE

(75) Inventor: Tim Tuan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 1113 days.

(21) Appl. No.: 13/050,394

(22) Filed: Mar. 17, 2011

(51) Int. Cl.
*G06F 13/00* (2006.01)
*G11C 7/10* (2006.01)
*G06F 13/38* (2006.01)

(52) U.S. Cl.
CPC ............ *G11C 7/1039* (2013.01); *G06F 13/385* (2013.01)

(58) Field of Classification Search
USPC .............. 370/24, 41, 48, 84, 91, 252, 351; 711/109, 169; 364/926.2; 713/500, 713/600; 710/305; 375/106, 117, 121; 365/189.05, 194, 230.08, 233
See application file for complete search history.

(56) References Cited

U.S. PATENT DOCUMENTS

| | | | |
|---|---|---|---|
| 5,379,327 A * | 1/1995 | Sharma et al. | 375/377 |
| 5,574,925 A * | 11/1996 | Paver | 712/25 |
| 5,583,450 A | 12/1996 | Trimberger et al. | |
| 5,600,263 A | 2/1997 | Trimberger et al. | |
| 5,629,637 A | 5/1997 | Trimberger et al. | |
| 5,646,545 A | 7/1997 | Trimberger et al. | |
| 5,701,441 A | 12/1997 | Trimberger | |
| 5,761,483 A | 6/1998 | Trimberger | |
| 5,778,439 A | 7/1998 | Trimberger et al. | |
| 5,784,313 A | 7/1998 | Trimberger et al. | |
| 5,825,662 A | 10/1998 | Trimberger | |
| 5,838,954 A | 11/1998 | Trimberger | |
| 5,920,899 A * | 7/1999 | Chu | 711/169 |
| 5,959,881 A | 9/1999 | Trimberger et al. | |
| 5,978,260 A | 11/1999 | Trimberger et al. | |
| 6,038,675 A * | 3/2000 | Gabzdyl et al. | 713/600 |
| 6,263,430 B1 | 7/2001 | Trimberger et al. | |
| 6,480,954 B2 | 11/2002 | Trimberger et al. | |
| 7,472,155 B2 | 12/2008 | Simkins et al. | |
| 7,746,108 B1 | 6/2010 | Young et al. | |
| 7,759,974 B1 | 7/2010 | Young | |
| 7,882,165 B2 | 2/2011 | Simkins et al. | |
| 8,072,893 B2 * | 12/2011 | Dielissen et al. | 370/252 |
| 2003/0123320 A1 * | 7/2003 | Wright et al. | 365/233 |
| 2005/0165995 A1 * | 7/2005 | Gemelli et al. | 710/305 |
| 2006/0190516 A1 | 8/2006 | Simkins et al. | |

OTHER PUBLICATIONS

U.S. Appl. No. 12/896,718, filed Oct. 1, 2010, Kaviani.
U.S. Appl. No. 12/896,742, filed Oct. 1, 2010, Kaviani.
U.S. Appl. No. 12/896,720, filed Oct. 1, 2010, Kaviani.

* cited by examiner

*Primary Examiner* — Andrew Lai
*Assistant Examiner* — Chuong M Nguyen
(74) *Attorney, Agent, or Firm* — W. Eric Webostad; John J. King

(57) ABSTRACT

A method for asynchronous time multiplexing of information with synchronous interfacing includes, responsive to a first edge of a clock signal, asynchronously loading first data, including first multiple sets of data for multiple operations, into a first asynchronous shift register. The first data is asynchronously unloaded from the first asynchronous shift register to a function block for processing to provide second data, including second multiple sets of data as results of the multiple operations. The second data is asynchronously loaded into a second asynchronous shift register. Responsive to a second edge of the clock signal, the second data is asynchronously unloaded from the second asynchronous shift register as the results of the multiple operations. The first edge and the second edge of the clock signal are associated with a same period of the clock signal.

20 Claims, 11 Drawing Sheets

US 9,355,690 B1

TIME-MULTIPLEXED, ASYNCHRONOUS DEVICE

FIELD OF THE INVENTION

An embodiment of the invention relates to integrated circuit devices ("ICs"). More particularly, an embodiment of the invention relates to a time-multiplexed, asynchronous device for an IC.

BACKGROUND

Integrated circuits ("ICs") have become more "dense" over time, i.e., more logic features have been implemented in an IC of a given size. Therefore, power consumption has become an increasingly more significant issue. Hence, it is desirable to provide an IC having reduced power consumption.

SUMMARY

One or more embodiments generally relate to a time-multiplexed, asynchronous device.

An embodiment relates generally to a method for asynchronous time multiplexing of information with synchronous interfacing. In such an embodiment, a clock signal is received. Responsive to a first edge of the clock signal, first data is asynchronously loaded into a first asynchronous shift register. The first data includes first multiple sets of data for multiple operations. The first data is asynchronously unloaded from the first asynchronous shift register to a function block. The first data is processed with the function block to provide second data. The second data includes second multiple sets of data as results of the multiple operations. The second data is asynchronously loaded into a second asynchronous shift register. Responsive to a second edge of the clock signal, the second data is asynchronously unloaded from the second asynchronous shift register as the results of the multiple operations. The first edge and the second edge of the clock signal are associated with a same period of the clock signal.

Another embodiment relates generally to another method for asynchronous time multiplexing of information with synchronous interfacing. In such other embodiment, a clock signal is received. Responsive to a first edge of the clock signal, a first request is initiated. Multiple sets of inputs are loaded via an input data interface. The loading is acknowledged. Each of the multiple sets of inputs is sequentially processed to provide respective sets of outputs. The sets of outputs are temporarily stored. A second request is initiated responsive to storage of the sets of outputs. Responsive to a second edge of the clock signal and the second request, the sets of outputs are unloaded via an output data interface. The sequentially processing of the multiple sets of inputs is asynchronously time multiplexed. The input data interface and the output data interface appear synchronous with respect to the clock signal.

Yet another embodiment relates generally to a circuit for asynchronous time multiplexing with synchronous interfacing. A synchronous-to-asynchronous converter is to receive a clock signal to cause first parallel data to be loaded. A first asynchronous shift register is to shift in the first parallel data and to shift out first serial data therefrom. A function block is to process the first serial data to provide second serial data. A second asynchronous shift register is to shift in the second serial data and to shift out second parallel data therefrom. An asynchronous-to-synchronous converter is to receive the clock signal to cause the second parallel data to be unloaded. Asynchronous pipelining of the first serial data and the second serial data from the first asynchronous shift register to the second asynchronous shift register provides for asynchronously time multiplexing multiple operations associated with multiple sets of data of the first parallel data.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION

Figure 1:
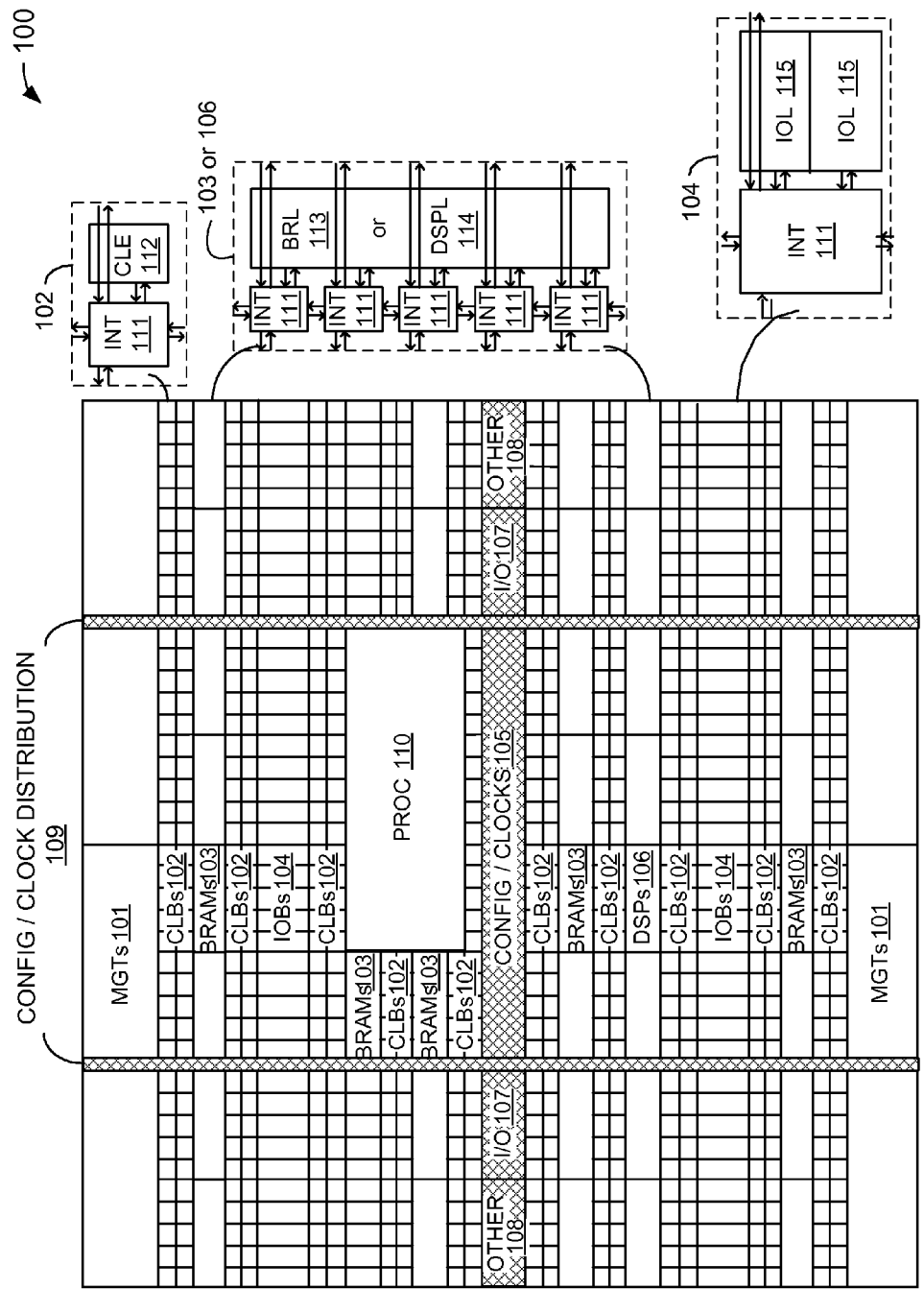
FIG. 1 is a simplified block diagram depicting an exemplary embodiment of a columnar Field Programmable Gate Array ("FPGA") architecture in which one or more aspects of the invention may be implemented.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As indicated above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the I/O logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Time multiplexing may be used to have a single circuit block perform work of many circuit blocks. However, time multiplexing a synchronous pipelined circuit block may involve a high-speed clock signal and relatively complex control logic operating at a frequency of such high-speed clock signal. The complexity increases substantially when latency and parallelism is programmable. Accordingly, such increase in clock frequency and circuit complexity may consume additional power.

As described below in additional detail, a time-multiplexed, asynchronous circuit time multiplexes a function block for asynchronous operation while maintaining a synchronous interface. Such a time-multiplexed, asynchronous circuit may be operated at a lower frequency clock signal with less complexity so as to consume less power. Thus, a high throughput and relatively robust time-multiplexed, asynchronous circuit may be provided that consumes less power than a comparable synchronous pipelined circuit. For purposes of clarity by way of example and not limitation, time-multiplexed, asynchronous digital signal processing is described with reference to DSP blocks, such as DSP tiles 106 of FPGA 100 of FIG. 1. It should be understood that DSP tiles 106 may operate at a substantially higher frequency than some programmable resources of FPGA programmable fabric of FPGA 100. However, the following description is not limited to DSP tiles of an FPGA. Rather, it should be understood that any design may be used provided time multiplexing multiple operations is allowed, and such time-multiplexed asynchronous circuit may be coupled to receive a clock signal.

Use of such a time-multiplexed, asynchronous circuit may avoid having to implement a high-frequency clock signal, as a relatively slower frequency clock signal associated with a synchronous domain may be used. Additionally, as will be appreciated in more depth from the following description, transparent pipelining may be provided with such a time-multiplexed, asynchronous circuit, which may be used to support programmable latency and/or parallelism.

Furthermore, having a synchronous interface allows such a time-multiplexed, asynchronous circuit to be modeled and tested using standardized synchronous models and tests. Effectively, such a synchronous interface may be used to hide asynchronous elements from a user. Accordingly, synchronous design and test flows may remain unchanged.

Figure 2:
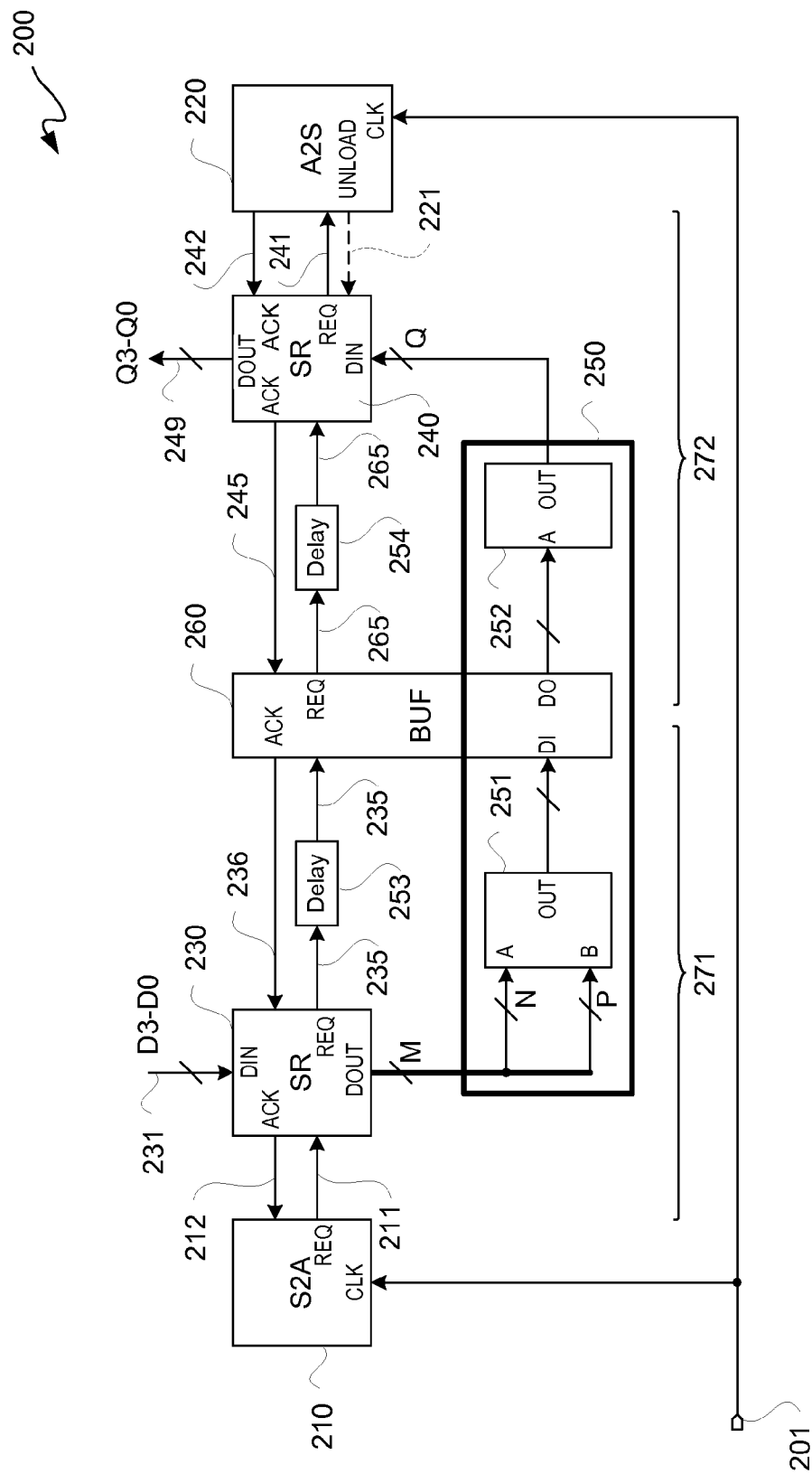
FIG. 2 is a block diagram depicting an exemplary embodiment of an asynchronous, time-multiplexed circuit.

FIG. 2 is a block diagram depicting an exemplary embodiment of an asynchronous, time-multiplexed circuit ("circuit") 200. Circuit 200 includes a synchronous interface with respect to clock signal 201 provided to clock ports of synchronous-to-asynchronous converter 210 and asynchronous-to-synchronous converter 220. Apart from such synchronous interface, between converters 210 and 220 circuit 200 is completely asynchronous. Furthermore, it should be understood that circuit 200 may carry out multiple operations within a single interval, such as a single period of clock signal 201. For purposes of clarity and not limitation, request and acknowledgement signals are used in accordance with how those terms are generally understood for purposes of asynchronous design.

Circuit 200, in addition to converters 210 and 220, includes asynchronous shift registers 230 and 240, and a function block 250. Optionally, circuit 200 may include a temporary storage buffer ("buffer") 260 and delay blocks ("delays") 253 and 254. In this exemplary embodiment, function block 250 includes two data operator blocks, namely operator 251 and operator 252. In other embodiments, function block 250 may include a single operator or more than two operators. Circuit 200 may include delays, such as delays 253 and 254 for example, to at least approximate delay associated with processing by one or more corresponding operators, such as for example operator 251 and operator 252, respectively. Buffer 260 is illustratively shown extending into function block 250, as data output from operator 251 may optionally be temporarily buffered or otherwise stored in buffer 260 prior to being provided to operator 252. Thus, it should be understood that for an embodiment with multiple operators, asynchronous temporary storage stages may be inserted between neighboring operators.

Responsive to an edge of clock signal 201, synchronous-to-asynchronous converter 210 asserts a request signal 211 provided to asynchronous shift register 230. Asynchronous shift register 230 may be thought of as a "load shift register." For purposes of clarity by way of example and not limitation, it shall be assumed that rising edges of clock signal 201 are used. However, it should be understood that in other embodiments falling edges or a combination of rising and falling edges of clock signal 201 may be used. Thus, for processing multiple sets of inputs or an initial set of input and one or more feedback iterations therefor, synchronous-to-asynchronous converter 210 may assert a request signal 211 for each rising edge of clock signal 201.

Responsive to assertion of request signal 211, asynchronous shift register 230 loads input data via data input bus 231 for multiple operations. Input data on data input bus 231 is input as parallel data and may include multiple sets of data corresponding to multiple operations to be performed on such sets of data. It should be understood that provided asynchronous shift register 230 is empty, in a data controlled mode embodiment asynchronous shift register 230 may have data loaded therein in advance of arrival of an edge of clock signal 201. However, in a clock controlled mode embodiment, asynchronous shift register 230 may be loaded only in response to arrival of an edge of clock signal 201. A data controlled mode generally may have higher throughput, and a clock controlled mode generally may consume less power. As either mode may be used, no differentiation is made in the following description with respect to a clock or data controlled mode.

In this example embodiment, it is assumed that the number of operations executed during a clock cycle, such as a period of clock signal 201, is four, as generally indicated by data D3-D0 for input data via data input bus or interface 231. It should be understood that used of the term operations is referring to sets of data completely processed through function block 250, which may be different than the number of sub-operations performed within function block 250 by one or more operators. In this exemplary embodiment, there are two sets of data for operations by operator 251, namely A3-A0 and B3-B0. It should be understood that in other embodiments fewer or more than four operations may be performed during a clock cycle. Thus for example, in other embodiments at least two operations may be performed during a period of clock signal 201. Furthermore, in other embodiments at least three operations may be performed during a period of clock signal 201.

After data D3-D0 is input to asynchronous shift register 230, asynchronous shift register 230 sends an acknowledgement signal 212 to synchronous-to-asynchronous converter 210. Thus for example, loading of data D3 may consist of loading data A3 and data B3. Moreover, loading of data D2 may consist of loading data A2 and data B2, and so on. In response to receiving acknowledgement signal 212, synchronous-to-asynchronous converter 210 de-asserts request signal 211.

In response to de-assertion of request signal 211, asynchronous shift register 230 is put into a shift mode. In a shift mode, asynchronous shift register 230 unloads input data by shifting out such data via a data output port of M bits wide, namely data bus M. It should be understood that data is output serially using multiple traces, namely "parallel bit-serial" format. Effectively, asynchronous shift register 230 may be thought of operating as a parallel-to-serial converter portion of an asynchronous pipeline to asynchronously shift in parallel data and asynchronously shift out serial data.

From data bus M, N data bits and P data bits may be respectively provided to an A port and a B port of operator 251. It should further be understood that M is an integer greater than one, but N and/or P may be integers equal to or greater than one. It should be understood that data bus M in an embodiment may have a width equivalent to N plus P. Thus bits are shifted out of asynchronous shift register 230 in a parallel bit-serial format.

In this exemplary embodiment, there are two input data ports for operator 251, where inputs from both of such data ports A and B are multiplied, added, or some other operation for providing output via an output port of operator 251. However, it should be understood that in other embodiments a single port or more than two ports may be used. With respect to a single port, input data may be operated upon itself, such as squaring such input data or accumulating input for example. Input data A3 and B3 may be input for processing by operator 251, followed by inputting data A2 and B2 for processing by operator 251, and so on. For purposes of clarity by way of example and not limitation, it shall be assumed that circuit 200 is a DSP configured for a multiply-accumulate process. Thus, operator 251 may be a multiplier, and operator 252 may be an accumulator. However, it should be understood that any of a number of types of data processing functions may be used. Thus, continuing the example of four sets of data inputs, circuit 200 may effectively perform like four DSPs, even though circuit 200 is a single DSP.

Figure 3:
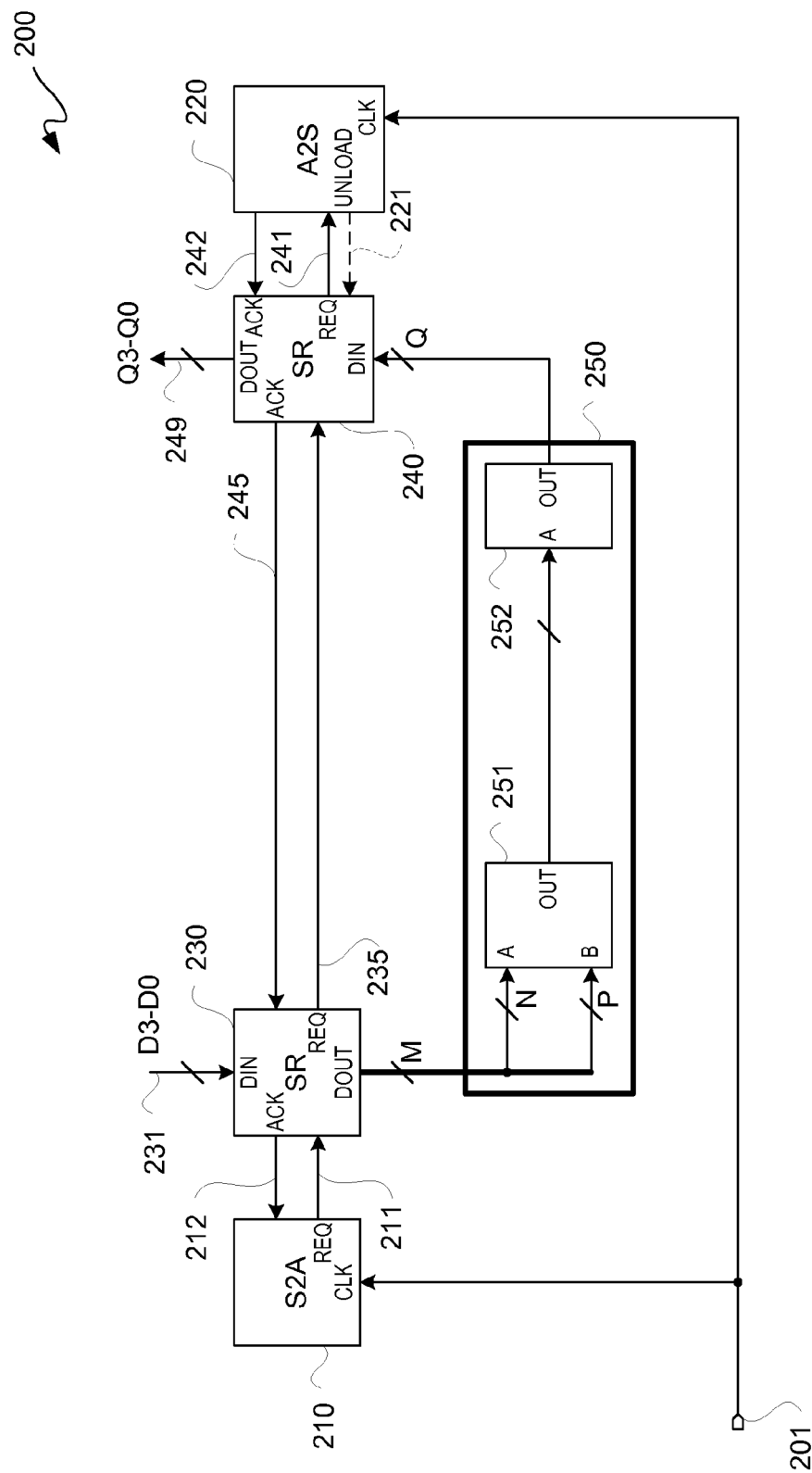
FIG. 3 is a block diagram of an exemplary embodiment of the circuit of FIG. 2 without an optional buffer and delays.

For now, it shall be assumed that delays 253 and 254, as well as buffer 260, are not included in circuit 200, and thus there may be direct communication between asynchronous shift register 230 and asynchronous shift register 240 as well as between operators 251 and 252 as illustratively depicted in the block diagram of FIG. 3, where there is shown an exemplary embodiment of circuit 200 without optional buffer 260 and delays 253 and 254.

With continuing reference to FIG. 3, request signal 235 may be asserted by asynchronous shift register 230 as sent to asynchronous shift register 240. In reply, asynchronous shift register 240 may send asynchronous shift register 230 an acknowledgement signal 245. In other words, request signal 235 may be asserted to indicate that data is ready to be output from asynchronous shift register 230 for internal processing by circuit 200. However, asynchronous shift register 240 may or may not be ready to store additional processed data, namely inputs of asynchronous shift register 240 may or may not be available. If asynchronous shift register 240 is ready to store additional processed data, then asynchronous shift register 240 sends an acknowledgement signal 245 in reply to assertion of request signal 235 by asynchronous shift register 230. If asynchronous shift register 240 is not ready to store additional processed data, generally asynchronous shift register 240 delays sending acknowledgement signal 245 until asynchronous shift register 240 is ready to store processed data.

Data output from an output port of operator 251 may be directly provided to an input port, namely an A port, of operator 252 of function block 250. After processing input data, operator 252 provides output serial data via an output data port thereof to a data input port of asynchronous shift register 240 via a Q bit wide data bus, for Q a positive integer greater than one. Serial data may be input to asynchronous shift register 240 in a parallel bit-serial format.

Asynchronous shift register 240 initially operates in an asynchronous shift register mode responsive to an acknowledgment signal 242 not being asserted. For purposes of clarity by way of example and not limitation, it shall be assumed that acknowledgment signal 242 is used and is logic low when not asserted and logic high when asserted. However, it should be understood that in other embodiments opposite logic states may be used. In another embodiment, an unload signal 221 may be used, as indicated as an option by a dashed line. Use of an unload signal is described in additional detail for example with reference to FIG. 12 below.

During segments of time within a clock cycle, asynchronous shift register 240 may have data loaded into it. When asynchronous shift register 240 is ready to unload its data, namely is in a full state for example, request signal 241 is asserted by asynchronous shift register 240. Simply put, timing of performing multiple operations may be defined to be completed within a defined interval of time, namely within a clock cycle or period of clock signal 201. So, when a next rising edge of clock signal 201 associated with an end of a clock cycle arrives at a clock port of asynchronous-to-synchronous converter 220, asynchronous-to-synchronous converter 220 asserts acknowledgment signal 242 provided to asynchronous shift register 240. Asynchronous shift register 240 may be thought of as an "unload shift register" at or toward an end of an asynchronous pipeline. Effectively asynchronous shift register 240 shifts in serial data and shifts out parallel data, as described below in additional detail. In response to assertion of acknowledgement signal 242, asynchronous shift register 240 de-asserts request signal 241 to asynchronous-to-synchronous converter 220. In reply to de-assertion of request signal 241, asynchronous-to-synchronous converter 220 de-asserts acknowledgement signal 242.

Accordingly, in response to assertion of request signal 241 and the next rising clock edge, asynchronous-to-synchronous converter 220 sends an acknowledgement signal 242 to asynchronous shift register 240. In response to receipt of the acknowledgement signal 242, asynchronous shift register 240 de-asserts request signal 241 and unloads data stored therein via a data output port thereof, namely unloads data via data output bus or interface 249. In response to unloading data and de-assertion of request signal 241, asynchronous shift register 240 clears acknowledgement signal 242. In other words, parallel data is unloaded from asynchronous shift register 240 responsive to a next clock edge, so circuit 200 is ready for data input associated with a subsequent clock cycle of clock signal 201.

It should be understood that without buffer 260, circuit 200 is a single stage device between converters 210 and 220. It should further be understood that between converters 210 and 220 no clock signal is used, and thus this overhead is avoided. It should further be understood that data input into asynchronous shift register 230 and data output from asynchronous shift register 240 is synchronized to respective rising edges of clock signal 201, which may define a clock period thereof. In other words, even though multiple operations are performed on multiple sets of data in an asynchronous manner, the input of such data and the output of such processed data externally appear as being synchronous with clock signal 201.

At this point, it should be appreciated that circuit 200 may be used to asynchronously perform multiple operations within a single clock cycle with a synchronous appearance at external data input and output interfaces. In such an asynchronous pipeline by having at least one internal pipeline asynchronous register or buffer, a second operation on a set of data may begin before a first operation on another set of data finishes. Thus, throughput may be increased by not having to process only a single set of data all the way through such asynchronous pipeline at a time before initiating processing on a next set of data. This may be thought of as a transparent form of pipelining for supporting different numbers of stages of asynchronous pipelining. After waiting for an initial stage of data to be moved to a next stage, a subsequent set of data may take the place of the initial stage of data, and so on. Thus, operations may overlap, where a prior operation is not completely finished before starting a stage of an immediately subsequent operation within a clock cycle. This facilitates flexible pipelining, such as flexible latency and/or operational parallelism, by not having additional control overhead, such as associated with changing clock frequencies for example. Rather, as described below in additional detail, assertion of a reset signal may be used to provide such flexibility.

It should further be appreciated that circuit 200 may be used to replace multiple instances of comparable functions of a synchronous design, where such multiple instances may correspond to a number of operations performed. In other words, multiple function blocks of a synchronous design may be replaced with a single function block 250 using circuit 200.

Returning to FIG. 2, assume that buffer 260, as well as delays 253 and 254 are added to circuit 200. For purposes of clarity by way of example not limitation, it shall be assumed that buffer 260 is a full asynchronous buffer, which may for example be two half buffers coupled in series. With the addition of buffer 260, circuit 200 is a multi-stage asynchronous pipeline circuit. In other words, circuit 200 has an input pipeline stage 271 and an output pipeline stage 272. However, even though circuit 200 has a synchronous interface to external circuitry, circuit 200 remains completely internally asynchronous between converters 210 and 220. Accordingly, circuit 200 is an asynchronous pipelined circuit with asynchronous interface that uses request and acknowledgement signals internally, as described in additional detail below, for asynchronous pipelined operation. It should be understood that the addition of buffer 260 may be used to increase throughput of circuit 200 by providing some parallel processing in function block 250 without otherwise significantly changing internal operation of circuit 200. Accordingly, it should be understood that circuit 200 provides flexibility with addition or deletion of asynchronous pipeline stages without significantly increasing circuit overhead and/or without substantial change to circuit behavior.

For circuit 200 having an input pipeline stage 271 and an output pipeline stage 272, sub-operations associated with operators 251 and 252 may be performed in parallel for some portion of a clock cycle. When asynchronous shift register 230 has data ready for output to operator 251, request signal 235 may be asserted by asynchronous shift register 230 for buffer 260. Request signal 235 may be delayed by delay 253 coupled between asynchronous shift register 230 and buffer 260. Delay 253 is to ensure that request signal 235 only arrives after completion of a current sub-operation by operator 251. In other words, delay 253 may generally match processing delay associated with operator 251. Hence, when request signal 235 is output from delay 253, it reaches buffer 260 in time to open data storage for storing output data from operator 251 without being too early.

In response to request signal 235, buffer 260 asserts an acknowledgement signal 236 to asynchronous shift register 230. In response to assertion of acknowledgement signal 236, asynchronous shift register 230 de-asserts request signal 235. It should be understood that buffer 260 is emptied before new data loaded into it. Thus, logic driving request signal 235 may assert such signal if acknowledgement signal 236 is logic low, as acknowledgement signal 236 generally indicates whether buffer 260 is full or not.

Data output from a data port of operator 251 may be provided to a data input port of buffer 260 for temporary storage in buffer 260. When buffer 260 has data ready for output to asynchronous shift register 240, buffer 260 may assert a request signal 265 for asynchronous shift register 240. Request signal 265 may be delayed by delay 254 coupled between buffer 260 and asynchronous shift register 240. Delay 254 is to ensure that request signal 265 only arrives after completion of a sub-operation by operator 252. In other words, delay 254 may generally match processing delay associated with operator 252. Hence, when request signal 265 is output from delay 254, it reaches asynchronous shift register 240 in time to open data storage for storing output data from operator 252 without being too early.

In response to request signal 265, asynchronous shift register 240 sends an acknowledgement signal 245 to buffer 260. In response to acknowledgement signal 245, buffer 260 de-asserts request signal 265. It should be understood that logic driving request signal 265 may assert such signal if acknowledgement signal 245 is logic low, namely for example after asynchronous shift register 240 is emptied and ready to accept new data. Output data provided via data output bus 249 of asynchronous shift register 240 for this exemplary embodiment may be four sets of data as generally indicated by Q3-Q0; however, in other embodiments, fewer or more sets of output data may be used.

Figure 4:
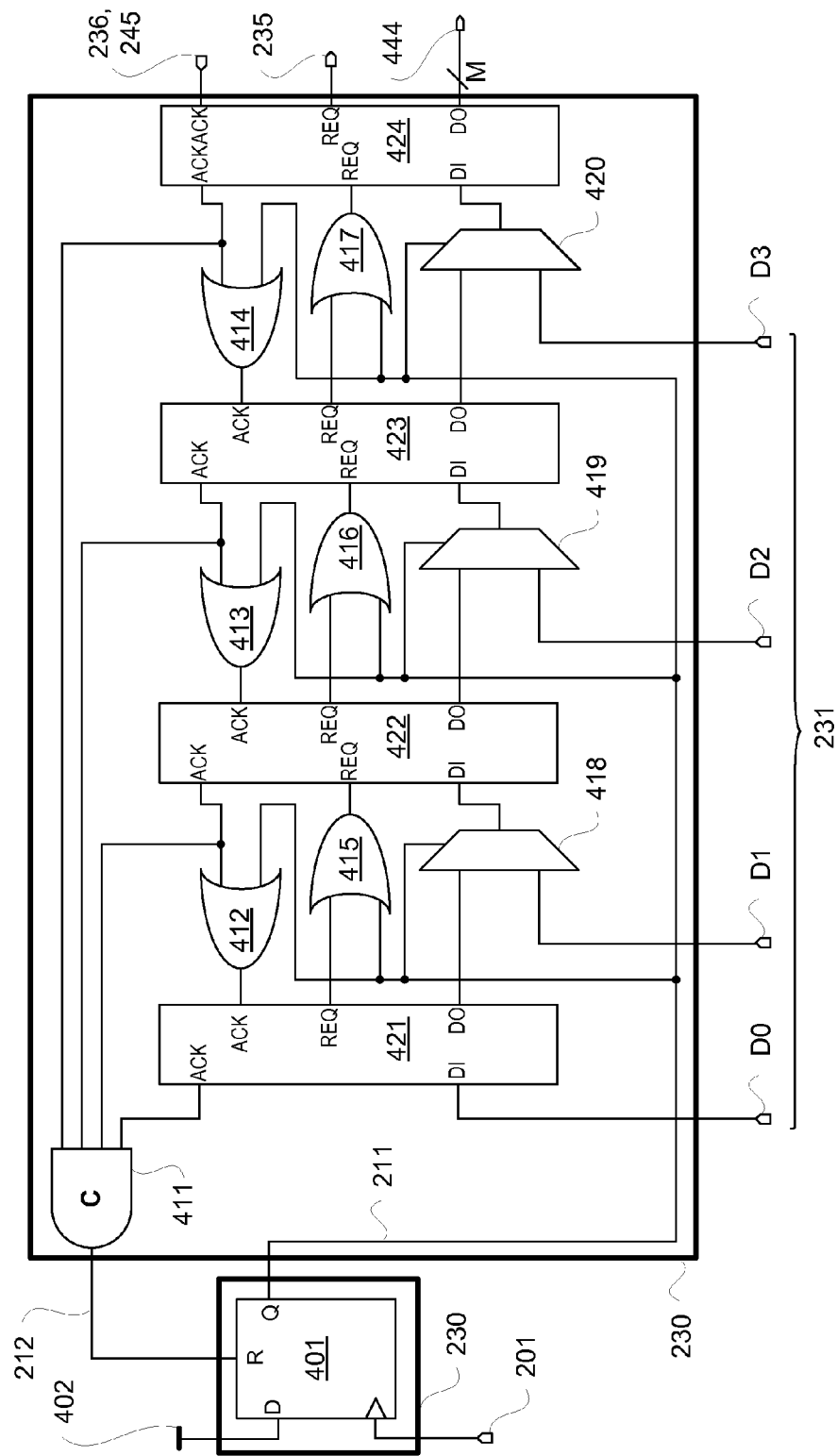
FIG. 4 is a block/circuit diagram depicting an exemplary embodiment of a synchronous-to-asynchronous converter and an asynchronous shift register.

FIG. 4 is a block/circuit diagram depicting an exemplary embodiment of a synchronous-to-asynchronous converter 210 and an asynchronous shift register 230. Synchronous-to-asynchronous converter 210 may be implemented as a register 401, such as a flip-flop.

A data input port of register 401 may be coupled to a supply voltage bus 402 to provide a logic high input, namely a binary logic 1. A clock input port of register 401 may be coupled to receive clock signal 201. A reset port of register 401 may be coupled to receive acknowledgement signal 212 output from a "c-element" or c-element 411 of asynchronous shift register 230.

C-element 411 has a logic high output signal, namely a binary 1, when all of its inputs are logic high. C-element 411 retains state of such a logic high output until all of its inputs are logic low, namely a binary 0. When all of the inputs of c-element 411 are logic low, c-element 411 outputs a logic low signal. C-element 411 retains state of such a logic low output until all of its inputs are logic high.

It should be understood that latency of circuit 200 of FIG. 2 may be varied by reset of converter 220. However, c-element 411 and number of stages of asynchronous shift register 230 may be varied for a design without adding significant external overhead and without departing from general behavior of circuit 200 of FIG. 2.

An output port of register 401 may be coupled to provide a request signal 211 as input to OR gates 412 through 417 of asynchronous shift register 230. Such output port of register 401 may be further coupled to provide request signal 211 as a control select signal to multiplexers 418 through 420 of asynchronous shift register 230.

Asynchronous shift register 230 may further include full asynchronous buffers ("buffers") 421 through 424. An acknowledgement signal from each of buffers 421 through 424 may be respectively coupled as an input to c-element 411. Acknowledgement signals from buffers 422 through 424 may be respectively provided as other inputs to OR gates 412 through 414. Outputs from OR gates 412 through 414 may be respectively provided as acknowledgement signal inputs to buffers 421 through 423. A request signal provided from each of buffers 421 through 423 may be respectively provided as another input to OR gates 415 through 417. Outputs from OR gates 415 through 417 may be respectively provided as request signal inputs to buffers 422 through 424. Data D0 of data input bus 231 may be provided to a data input port of buffer 421. Data D1 through D3 of data input bus 231 may be respectively provided to data input ports of multiplexers 418 through 420. Data output ports of buffers 421 through 423 may be respectively coupled to other data input ports of multiplexers 418 through 420. Outputs of multiplexers 418 through 420 may be respectively coupled to data input ports of buffers 422 through 424.

A data output port of buffer 424 is coupled to an M data bus to provide data signal 444 thereto. Accordingly, it should be appreciated that each of buffers 421 through 424 collectively are loaded with parallel data, and asynchronously shifted out via buffer 424 such data in parallel bit-serial streams. A request port of buffer 424 is used to source request signal 235. An acknowledgement port of buffer 424 is used to receive acknowledgement signal 245 or 236 as respectively described with reference to FIGS. 2 and 3.

Figure 5:
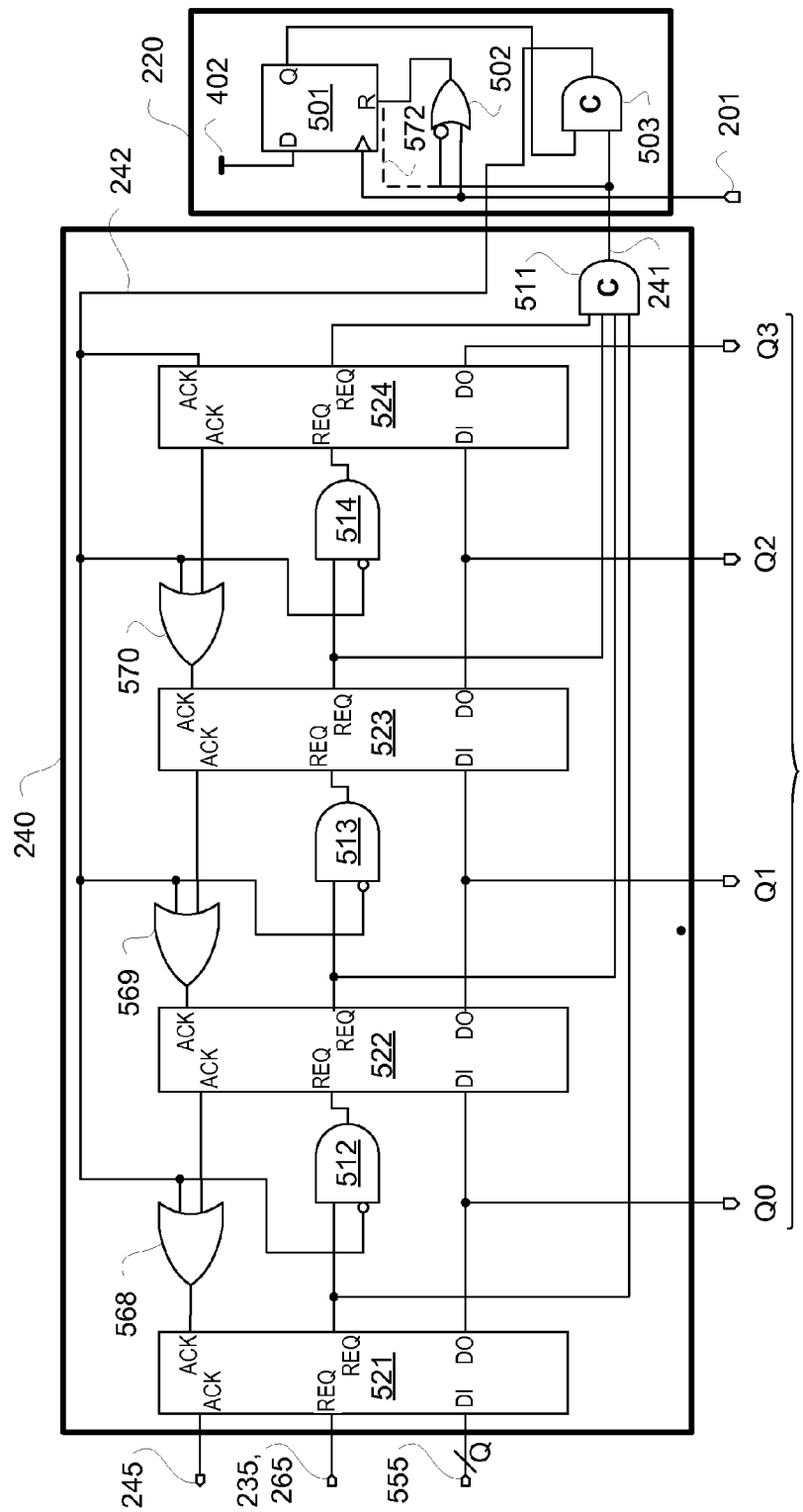
FIG. 5 is a block/circuit diagram depicting an exemplary embodiment of an asynchronous-to-synchronous converter and an asynchronous shift register.
Figure 12:
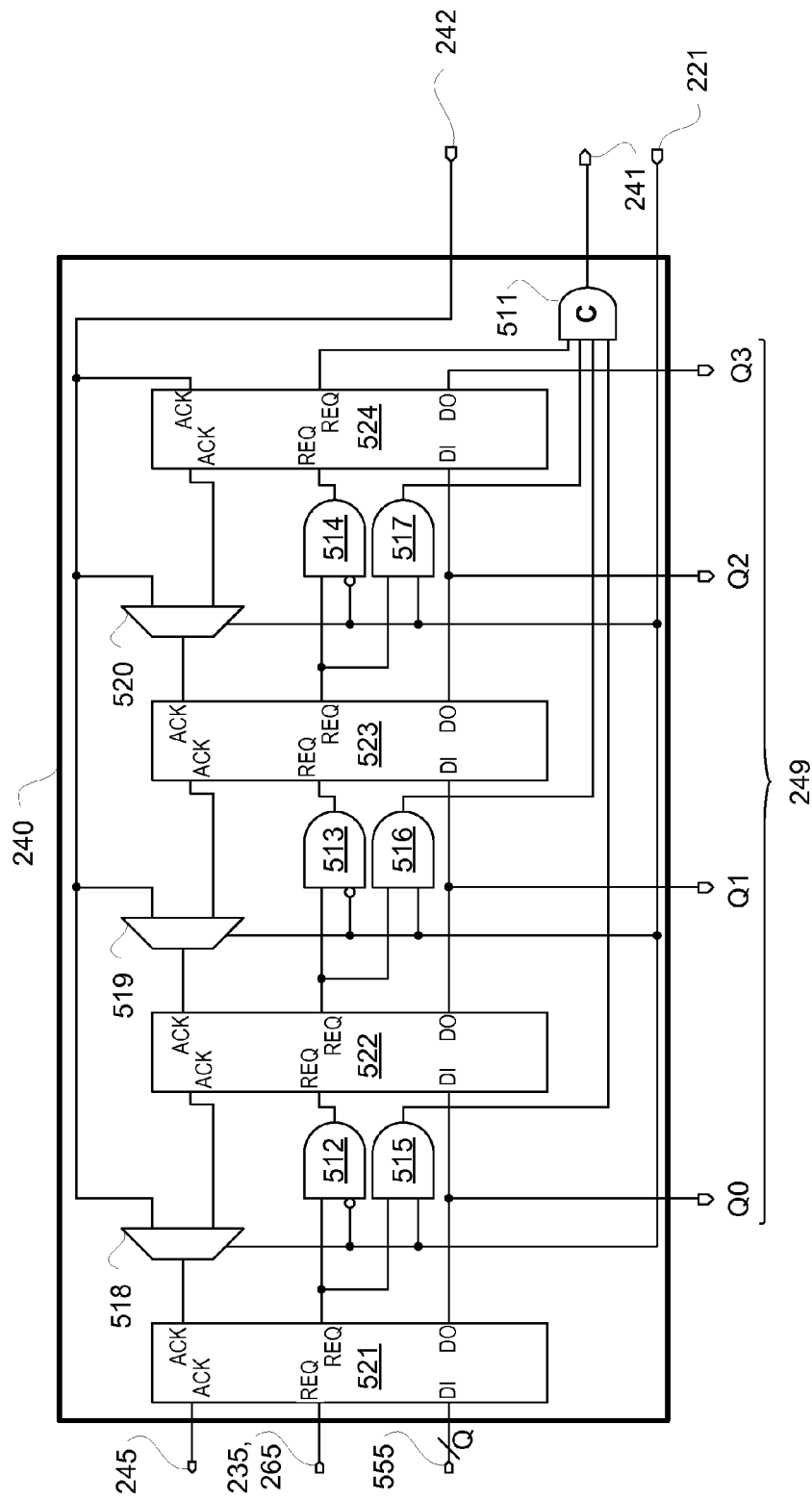

FIG. 5 is a block/circuit diagram depicting an exemplary embodiment of each of an asynchronous-to-synchronous converter 220 and an asynchronous shift register 240 without unload signal 221. FIG. 12 is a block/circuit diagram depicting an exemplary embodiment of each of asynchronous shift register 240 with unload signal 221. Asynchronous-to-synchronous converter 220 of FIG. 5 may be used with asynchronous shift register 240 of FIG. 12, where unload signal 221 is sourced from the output of register 501 of asynchronous-to-synchronous converter 220. For purposes of clarity and not limitation, asynchronous-to-synchronous converter 220 and an asynchronous shift register 240 of FIG. 5 is described. However, description of FIG. 5 is with simultaneous reference to asynchronous-to-synchronous asynchronous shift register 240 of FIG. 12, where differences between the embodiments are described. In this exemplary embodiment, asynchronous-to-synchronous converter 220 includes register 501, OR gate 502, and c-element 503.

Clock signal 201 is provided to a clock input port of register 501. A data input port of register 501 is coupled to supply voltage bus 402 to provide a logic high input, namely a binary logic 1. An output port of register 501 is provided as an input to c-element 503. A request signal 241, or more particularly an unload_request signal, output from c-element 511 of asynchronous shift register 240 is provided as another input to c-element 503. Request signal 241 is further provided to an inverted port or inverter of OR gate 502. In another embodiment, OR gate 502 may be omitted, and request signal 241 may be directly provided to a reset port of register 501, as generally indicated by dashed line 572. Output of c-element 503 is provided as acknowledgement signal 242. Another input to OR gate 502 is clock signal 201. Output of OR gate 502 is provided as an input to a reset port of register 501.

In this exemplary embodiment, asynchronous shift register 240 includes OR gates 568 through 570, AND gates 512 through 514, full asynchronous buffers ("buffers") 521 through 524, and c-element 511. Instead of OR gates, the embodiment of asynchronous shift register 240 of FIG. 12 uses multiplexers 518 through 520, and additionally includes AND gates 512 through 517, buffers 521 through 524, and c-element 511. Acknowledgement signal 242 is provided as an input to an acknowledgement port of buffer 524, and as an input to each of OR gates 568 through 570, or multiplexers 518 through 520 in FIG. 12. Acknowledgement outputs from buffers 522 through 524 are respectively provided as inputs to OR gates 568 through 570, or multiplexers 518 through 520 in FIG. 12. An acknowledgement signal 245 is output from an acknowledgement port of buffer 521. For the embodiment of FIG. 12, unload signal 221, which is output from register 501, is provided as a control select input to each of multiplexers 518 through 520. Outputs from OR gates 568 through 570, or multiplexers 518 through 520 of FIG. 12, are respectively provided as inputs to acknowledgement ports of buffers 521 through 523.

In FIG. 5, acknowledgement signal 242 is further provided as an input to inverted port or inverter of each of AND gates 512 through 514. In FIG. 12, unload signal 221 is further provided as an input to inverted port or inverter of each of AND gates 512 through 514. Furthermore, in FIG. 12, unload signal 221 is provided as an input to each of AND gates 515 through 517. A request port of buffer 521 receives request signal 235 or 265, as previously described. A request signal output from buffer 521 is provided as another input to AND gate 512, or AND gates 512 and 515 in FIG. 12. More generally, request signal outputs from buffers 521 through 523 are respectively provided as inputs to AND gates 512 through 514. Output from AND gate 512 is provided to a request port of buffer 522. More generally, outputs of AND gates 512 through 514 are respectively provided as inputs to request ports of buffers 522 through 524. In FIG. 5, outputs from request ports of buffers 521 through 524 are provided as inputs to c-element 511. In FIG. 12, outputs of AND gates 515 through 517, as well as an output of a request port of buffer 524, are provided inputs to c-element 511.

A request port of buffer 522 in response to a previously received request signal from a neighboring buffer, as previously described, provides a request signal output. In FIG. 5, such a request signal output from buffer 522 is provided as input to AND gate 513. In FIG. 12, such a request signal output from buffer 522 is provided as input to AND gates 513 and 516; output from AND gate 513 is provided to a request port of buffer 523.

A request port of buffer 523 in response to a previously received request signal from a neighboring buffer, as previously described, provides a request signal output. In FIG. 5, such a request signal output from buffer 523 is provided as input to AND gate 514. In FIG. 12, such a request signal output from buffer 523 is provided as input to AND gates 514 and 517; output from AND gate 514 is provided to a request port of buffer 524; and output of AND gate 517 is provided as another input to c-element 511.

Lastly, a request port of buffer 524 in response to a previously received request signal from a neighboring buffer, as previously described, provides a request signal output. In FIG. 5 and FIG. 12, such a request signal output from buffer 524 is provided as input to c-element 511. Output from c-element 511 is provided as request signal 241 to asynchronous-to-synchronous converter 220, as previously described.

Buffer 521 receives a data signal 555 to a data input port via a Q bus. A data output port of buffer 521 is directly coupled to data input port of buffer 522. A data output port of buffer 522 is directly coupled to a data input port of buffer 523. A data output port of buffer 523 is directly coupled to a data input port of buffer 524. A data output port of buffer 524 is a data tap for data output Q3. Data taps for Q0 through Q2 are respectively obtained from data output ports of buffers 521 through 523. Accordingly, output ports of buffers 521 through 524 provide output data via data output bus 249.

Figure 6:
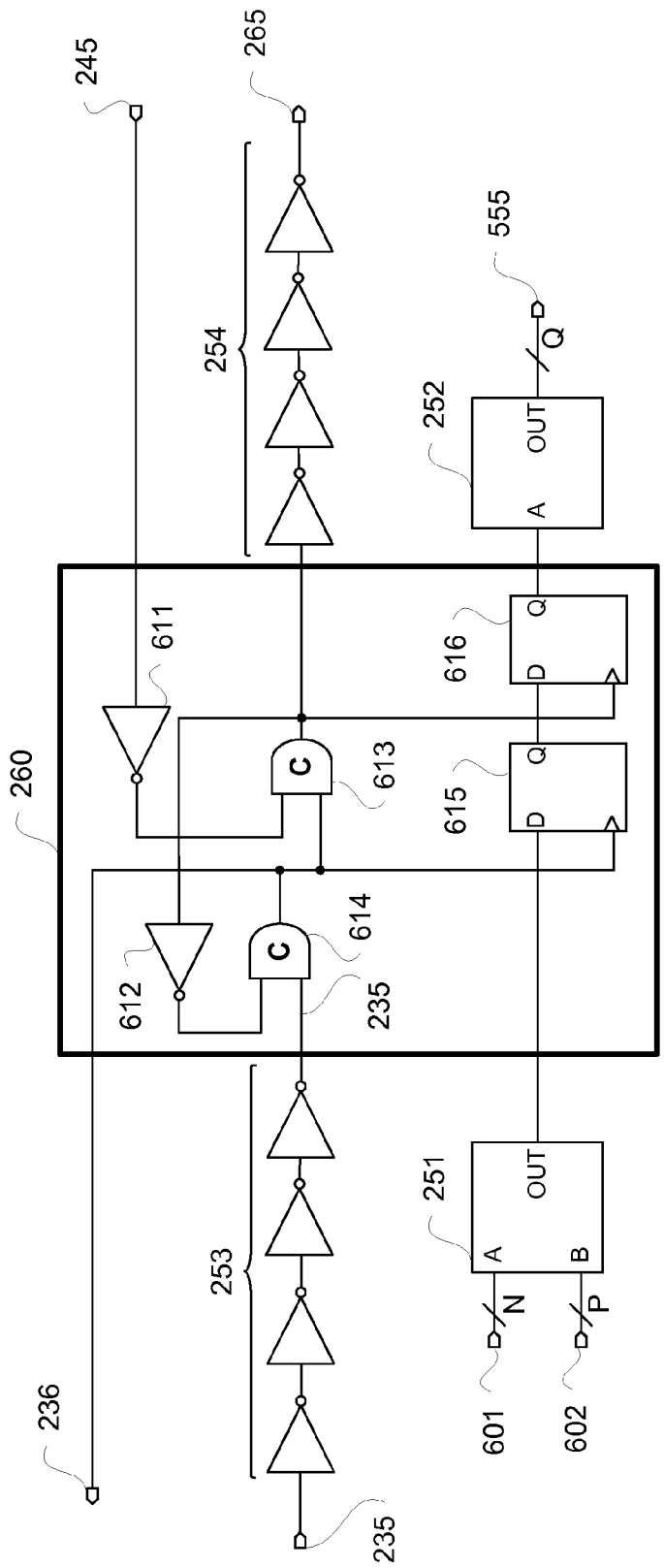
FIG. 6 is a block/circuit diagram depicting an exemplary embodiment of a portion of the circuit of FIG. 2.

FIG. 6 is a block/circuit diagram depicting an exemplary embodiment of a portion of circuit 200 of FIG. 2. More particularly, example implementations for buffer 260 and delays 253 and 254 are illustratively depicted. Buffer 260 includes inverter 611 and 612, c-element 613 and 614, and latches or registers 615 and 616.

Acknowledgement signal 245 is provided as an input to inverter 611. Output of inverter 611 is provided as an input to c-element 613. Request signal 235 is provided to delay 253. In this exemplary embodiment, delays 253 and 254 are each made up of a set of four inverters coupled in series. However, it should be understood that in other embodiments fewer or more than four inverters or other delay elements coupled in series may be used.

Output from delay 253 is a delayed version of request signal 235, which delayed version is input to c-element 614. Output of c-element 614 is provided to a clock input port of register or latch 615, and an input of c-element 613, as well as output as acknowledgement signal 236. In this exemplary embodiment, an inverted clock signal is used, so data passes when such clock signal is low. However, in other embodiments, a non-inverted clock signal may be used. Output of c-element 613 is provided to a clock input port of register or latch 616 and an input of inverter 612, as well as output as request signal 265. It should be understood that even though outputs of gates 613 and 614 are provided to clock ports of registers as previously describe, such signal are not clock signals. Request signal 265 is provided to delay 254, and output of delay 254 is a delayed version of request signal 265. Output of inverter 612 is provided as another input of c-element 614.

Data signal 601 via N bus and data signal 602 via P bus are provided as inputs to operator 251. Data output from operator 251 is provided to a data input port of latch 615. Data output from latch 615 is provided to a data input port of c-element 613. Data output from latch 613 is provided as input data to operator 252 for subsequent processing to provide output data 555 via a Q bus.

Again, delays associated with delays 253 and 254 may be configured to match delays associated with operators 251 and 252, respectively.

To enhance time multiplexing blocks with relatively long latency, block latency of circuit 200 may be configured to span multiple cycles. For purposes of clarity by way of example and not limitation, suppose a block with an 5 ns total data path delay pipeline for 1 GHz throughput, namely 1 ns per stage, is configured to perform four-way time multiplexing for applications up to 111 MHz, namely greater than or equal to a 8 ns clock period. In other words, to perform four operations in an 8 ns clock period, the first operation takes 5 ns followed by three successive operations of 1 ns each for an 8 ns clock period. In such an example, if block delay can be expanded to span two clock cycles, then the same circuit may be used to perform four-way time multiplexing for designs up to 222 MHz, namely greater than or equal to a 4.5 ns clock period. Thus by having block latency span multiple cycles of a clock signal, embodiments may be more useful for high-speed applications. To support multi-cycle latency in circuit 200 of FIG. 2, asynchronous-to-synchronous converter 220 is held in a reset state for one extra clock cycle during an initial sequence of processing, namely for processing an initial set of input data sets.

Figure 7:
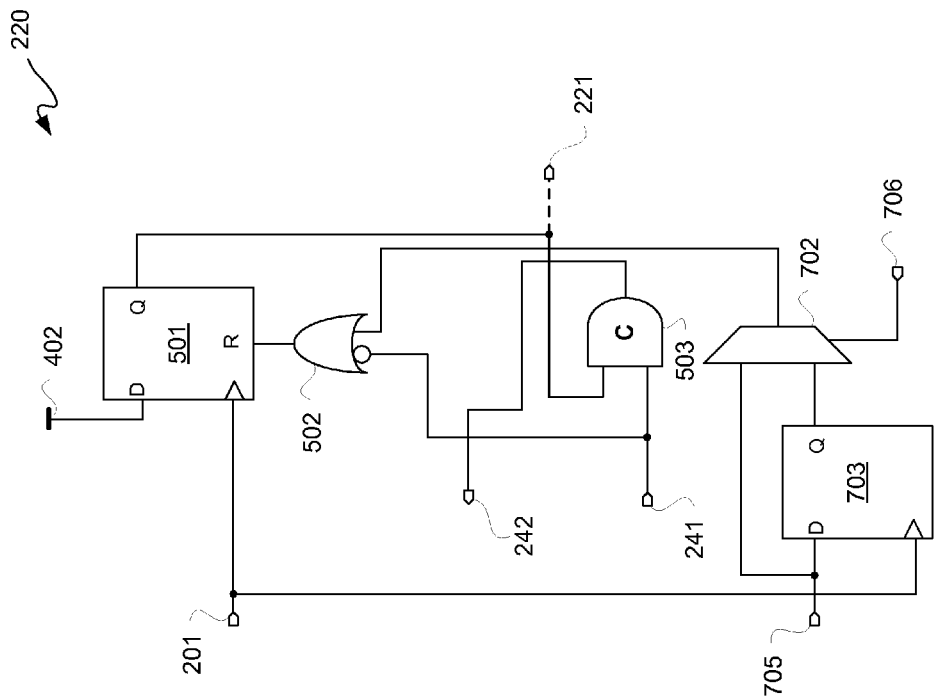
FIG. 7 is a circuit diagram depicting another exemplary embodiment of an asynchronous-to-synchronous converter.

FIG. 7 is a circuit diagram depicting another exemplary embodiment of an asynchronous-to-synchronous converter 220. Other than the addition of multiplexer 702 and register 703, as well as associated signaling, asynchronous-to-synchronous converter 220 of FIG. 7 is similar to asynchronous-to-synchronous converter 220 of FIG. 5. Again, an unload signal 221 may be used in the embodiment of FIG. 12, and such unload signal 221 may be sourced from an output of register 501.

Output of multiplexer 702 is provided as an input to OR gate 502, and as previously described another input to OR gate 502 is request signal 241. Again, output of OR gate 502 is provided as an input to a reset port of register 501. A clock input port of each of registers 501 and 703 is coupled to receive clock signal 201. A data input port of register 703 is coupled to receive reset signal 705. Reset signal 705 is further provided as an input to multiplexer 702, and output of register 703 is provided as another input to multiplexer 702. A multi-cycle signal 706 is provided as a control select input to multiplexer 702. Again, an output port of register 501 is provided as an input to c-element 503, and a request signal 241, such as output from c-element 511 of asynchronous shift register 240, is provided as another input to c-element 503. Output of c-element 503 is provided as acknowledgement signal 242.

Responsive to multi-cycle signal 706 being a logic 0, output of multiplexer 702 is a reset signal 705 without being delayed by register 703. In this state, asynchronous-to-synchronous converter 220 is not held for one extra clock cycle in a reset state for an initial sequence of processing data.

Responsive to multi-cycle signal 706 being a logic 1, output of multiplexer 702 is a reset signal 705 output from register 703, namely delayed by register 703 by one extra clock cycle in this embodiment. Holding asynchronous-to-synchronous converter 220 in a reset state for an extra clock cycle forces an asynchronous pipeline hereof to take at least two clock cycles to complete a first set of operations. Thereafter, such asynchronous pipeline may complete one set of operations per clock cycle. Thus, in this embodiment, a two clock cycle latency is described for an initial sequence of processing so as to increase throughput. This hold in a reset state may only be for an initial set of data to be processed, and thus subsequent sets of associated data may be processed without adding another clock cycle of latency, namely multi-cycle signal 706 may be transitioned to a logic 0 for subsequent processing after the initial set of data sets is processed.

As previously indicated by way of example not limitation, the additional clock cycle latency may be used to increase throughput. In some embodiments, it may be useful to increase pipeline depth in order to hold data spanning multiple clock cycles, which in this embodiment is two clock cycles. However, it should be understood that greater than two cycle clock latency may be used. In such other embodiments, reset signal 705 may be further delayed, such as by the addition of registers in addition to register 703 for example, for further delaying reset of register 501. In yet other embodiments, multiple sets of registers of varying register chain lengths may be coupled in parallel for input to a wider multiplexer for selection of a desired latency.

Figures 8, 9:
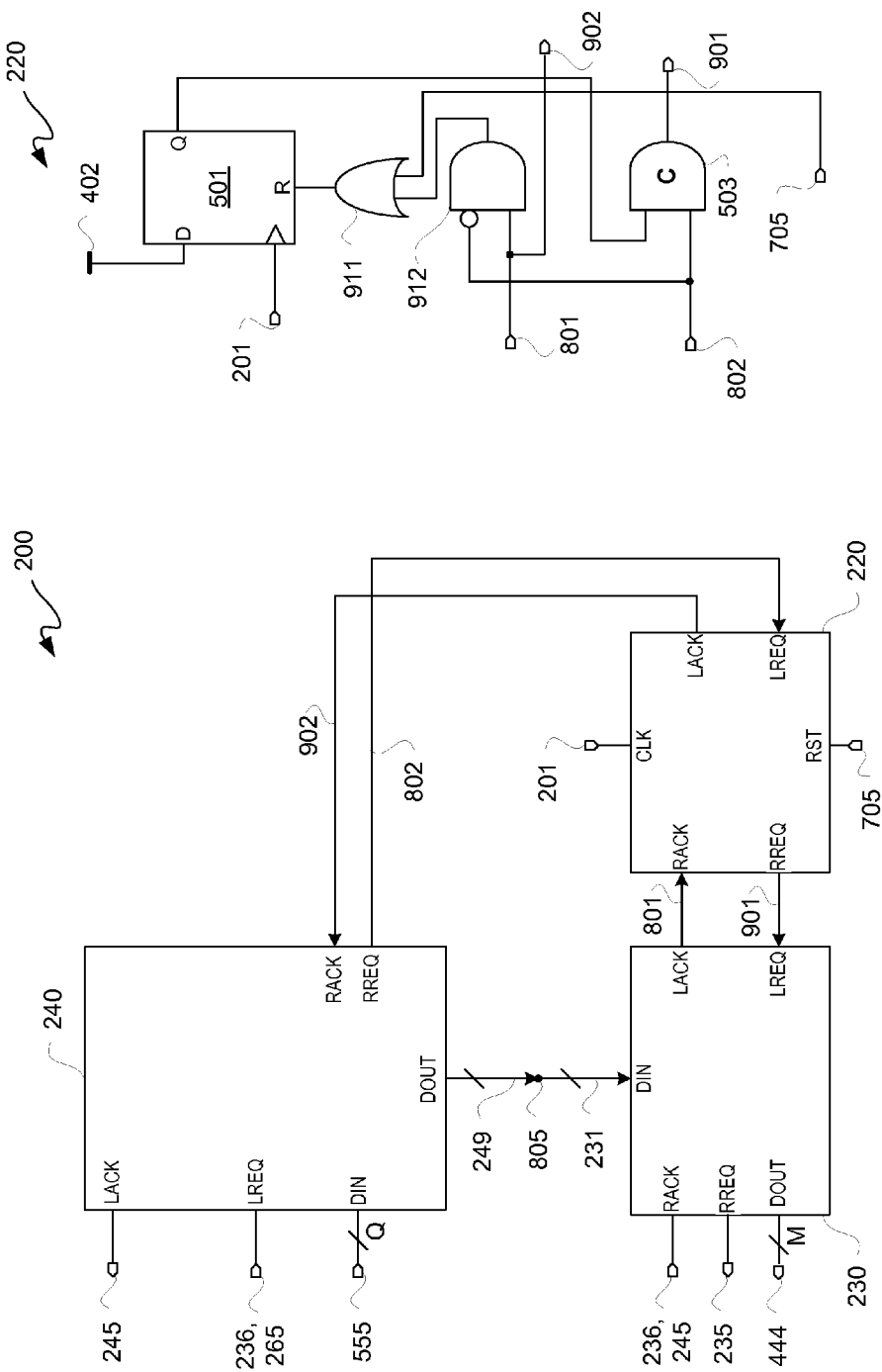
FIG. 8 is a block diagram depicting yet another exemplary embodiment of an asynchronous, time-multiplexed circuit.
FIG. 9 is a circuit diagram depicting yet another exemplary embodiment of an asynchronous-to-synchronous converter for use in the asynchronous, time-multiplexed circuit of FIG. 8.

FIG. 8 is a block diagram depicting yet another exemplary embodiment of a circuit 200. For purposes of clarity, synchronous-to-asynchronous converter 210 and function block 250 have been omitted, but would be included in such an embodiment otherwise. Additionally, for purposes of clarity by way of example not limitation, nomenclatures using either "R" or "L" generally indicate whether the signal port is on the right and/or the left with respect to circuit 200 of FIG. 2.

DSPs may have feedback paths going from an output to an input, such as in a multiply-accumulate configuration for example. As output of such DSPs may be synchronous, such feedback paths may not be directly mapped to asynchronous circuits. To address this, a feedback path is treated both as an output and input, as described below in additional detail. Additionally, FIG. 9 is a circuit diagram depicting yet another exemplary embodiment of an asynchronous-to-synchronous converter 220; however, asynchronous-to-synchronous converter 220 of FIG. 9 is for use in circuit 200 of FIG. 8. Accordingly, circuit 200 of FIG. 8 is described in additional detail with simultaneous reference to FIG. 9.

From a request port ("RREQ") of asynchronous-to-synchronous converter 220, a request signal 901 is sent to a request port ("LREQ") of asynchronous shift register 230 as a feedback signal. Request signal 901 may be sourced from the output of c-element 503.

A request signal ("RREQ") 901 may be provided from asynchronous-to-synchronous converter 220 to asynchronous shift register 230. Responsive, as previously described, to such a request, an acknowledgement signal ("LACK") 801 may be provided to asynchronous-to-synchronous converter 220 from asynchronous shift register 230.

A request signal ("RREQ") 802 from asynchronous shift register 240 may be provided to a request port of asynchronous-to-synchronous converter 220. Responsive, as previously described, to such request, an acknowledgement signal ("RACK") 902 may be provided from asynchronous-to-synchronous converter 220 to asynchronous shift register 240. It should be understood that acknowledgement signal 801 and acknowledgement signal 902 are the same signal, though the latter is after passing through asynchronous-to-synchronous converter 220. It should further be understood that acknowledgement signal 801 may be acknowledgement signal 212, as previously described.

A data output bus 249 associated with a data output port of asynchronous shift register 240 may be fanned out to node 805 and to data input bus 231, the latter of which is associated with a data input port of asynchronous shift register 230. Thus, data output from asynchronous shift register 240 may be fed back as input data to asynchronous shift register 230 when in a feedback mode responsive to request signal 901.

Acknowledgement signal 801 is provided as an input to AND gate 912. Request signal 802 is provided as an input to c-element 503 and as an input to an inverted port or inverter of AND gate 912.

In this exemplary embodiment, asynchronous-to-synchronous converter 220 includes an OR gate 911. OR gate 911 receives as inputs an output from AND gate 912 and reset signal 705. An output of OR gate 911 is provided to a reset port of register 501. Thus, it should be understood that even though this depicted embodiment of asynchronous-to-synchronous converter 220 is for single clock cycle operation, it may be modified with reset logic as previously described with reference to FIG. 7 in another embodiment for supporting multi-cycle latency for an initial sequence of processing.

Even though the example of a DSP was used for circuit 200 as described above, circuit 200 may be a floating point unit or other relatively repetitive circuit instance device. Thus, rather than having multiple instances of circuitry associated with such a device, a single instance of an asynchronous pipeline having one or more stages provided with circuit 200 may be used.

By replacing multiple synchronous circuit instances with a single instance of an asynchronous pipeline with a synchronous interface as described herein, overhead may be reduced to save power. It should be understood that some complex circuits may be used relatively infrequently, and thus use of circuit 200 as described above may be a reasonable substitute for trading performance for power savings. However, by adding internal buffers to such asynchronous pipeline, performance of such asynchronous pipeline may be increased with a modicum of additional overhead.

In an FPGA or other programmable resources uses with a finite number of such programmable resources, uses of circuit 200 may be applicable to implementing single circuit instances in order to conserve such resources for other portions of a design. Furthermore, with respect to an implementation associated with programmable resources or other implementation, asynchronous operation may be transparent to a user or designer. In other words, because circuit 200 has a synchronous interface, operation of circuit 200 to the outside world may appear synchronous even though internal operation is asynchronous.

Figure 10:
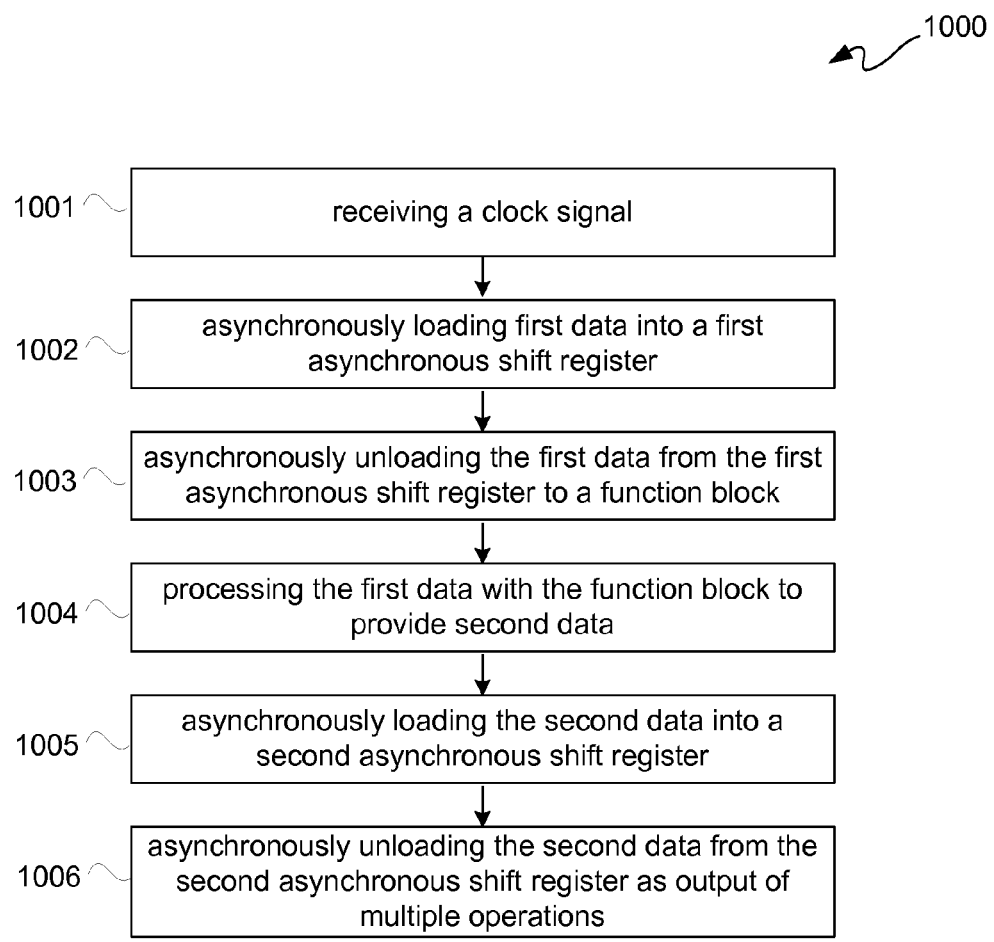
FIG. 10 is a flow diagram depicting an exemplary embodiment of a process for asynchronous time multiplexing of information with synchronous interfacing.
Figure 11:
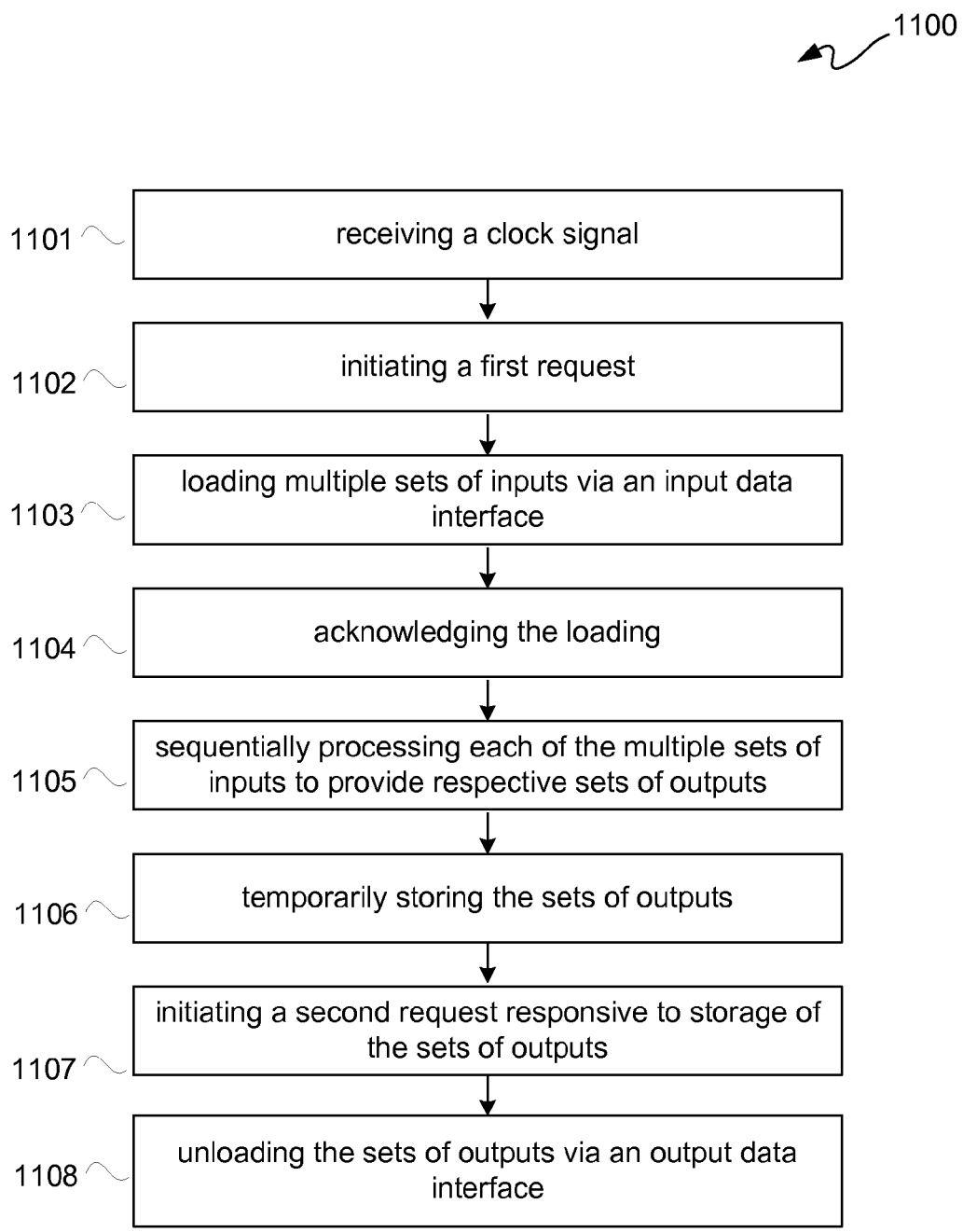
FIG. 11 is a flow diagram depicting another exemplary embodiment of a process for asynchronous time multiplexing of information with synchronous interfacing.

FIG. 10 is a flow diagram depicting an exemplary embodiment of a process 1000 for asynchronous time multiplexing of information with synchronous interfacing. FIG. 11 is a flow diagram depicting another exemplary embodiment of a process 1100 for asynchronous time multiplexing of information with synchronous interfacing. FIGS. 10 and 11 are described with general reference to one or more of the above-described embodiments in FIGS. 2 through 9.

With reference to FIG. 10, at 1001, a clock signal is received. At 1002, first data is asynchronously loaded into a first asynchronous shift register. Such first data may be asynchronously loaded responsive to a first edge of the clock signal. The first data includes first multiple sets of data for multiple operations. Moreover, responsive to such a first edge of the clock signal, a first request signal may be asserted by asynchronous-to-asynchronous converter for providing to the first asynchronous shift register. Furthermore, a first acknowledgement signal may be sent from the first asynchronous shift register to the synchronous-to-asynchronous converter in reply to completion of the asynchronous loading of the first data. In response to the first acknowledgement signal, the first request signal may be asserted by the synchronous-to-asynchronous converter.

At 1003, the first data is asynchronously unloaded from the first asynchronous shift register into a function block. The asynchronous unloading of the first data may be from the first asynchronous shift register for loading into a function block responsive to de-assertion of the first request signal. At 1004, the first data is processed with the function block to provide second data. The second data includes second multiple sets of data as results for the multiple operations. At 1005, the second data is asynchronously loaded into a second asynchronous shift register. At 1006, the second data is asynchronously unloaded from the second asynchronous shift register as output of the multiple operations. The second data may be asynchronously unloaded response to a second edge of the clock signal. More particularly, an unload signal may be asserted by an asynchronous-to-synchronous converter responsive to the second edge of the clock signal and a full condition of the second asynchronous shift register. A second request signal may be asserted by the second asynchronous shift register for providing to the asynchronous-to-synchronous converter responsive to assertion of the unload signal. Moreover, a second acknowledgement signal may be sent by the asynchronous-to-synchronous converter to the second asynchronous shift register in response to the second request signal. The asynchronously unloading by the second asynchronous shift register may be in response to the second acknowledgement signal. The second request signal may be de-asserted by the second asynchronous shift register responsive to the second acknowledgement signal. Assertion of the unload signal may be cleared by the second asynchronous shift register responsive to the second acknowledgement signal.

The first edge and the second edge of the clock signal are associated with a same period of the clock signal. Furthermore, it should be understood that in an embodiment, if the first data is an initial set of data, then at least one clock cycle of latency may be added for an initial set of multiple operations processed asynchronously from the asynchronous loading of the first data to the asynchronously unloading of the second data. Furthermore, it should be understood that in another embodiment, selection may be made between a feedback mode and a feed forward mode. If a feedback mode is entered or selected, the second data may be fed back as the first data for subsequent processing, namely for an iteration of processing such second data as first data. Such feedback is may be for one or more iterations.

With reference to FIG. 11, at 1101, a clock signal is received. At 1102, a first request is initiated. The first request may be initiated responsive to a first edge of the clock signal. At 1103, multiple sets of inputs are loaded via an input data interface. At 1104, the loading is acknowledged.

At 1105, each of the multiple sets of inputs is sequentially processed to provide respective sets of outputs. At 1106, the sets of outputs are temporarily stored. At 1107, the second request is initiated responsive to storage of the sets of outputs. At 1108, the sets of outputs are unloaded via an output data interface. The sets of outputs may be unloaded responsive to a second edge of the clock signal and assertion of the second request. The sequential processing of the multiple sets of inputs may be asynchronously time multiplexed. Furthermore, input and an output data interfaces may appear synchronous with respect to the clock signal.

The input data interface and the output data interface are for parallel data input and parallel data output, respectively. The multiple sets of inputs may be asynchronously shifted in with the loading as first parallel data. The multiple sets of inputs may be asynchronously shifted out sequentially as M-bit wide first serial data for the sequential processing thereof for M a positive integer greater than 1. The sets of outputs may be asynchronously shifted in as Q-bit wide second serial data for the temporary storing for Q a positive integer greater than 1. The sets of outputs may be asynchronously shifted out for the unloading as second parallel data. In an embodiment, the unloading of the sets of outputs may be delayed by at least one clock cycle of the clock signal. Again, selection may be made between a feedback mode and a feed forward mode. If a feedback mode is entered, the sets of outputs unloaded may be fed back as the multiple sets of inputs for the loading anew, namely another iteration of processing such multiple sets of inputs.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. For example, some embodiments herein are described in terms of an exemplary implementation using one or more FPGAs. However, the circuits and methods of the invention are not limited to implementations using FPGAs or other PLDs. Claims listing steps do not imply any order of the steps. Trademarks are the property of their respective owners.

What is claimed is:

1. A method for asynchronous time multiplexing of information with synchronous interfacing, comprising:
   receiving a clock signal;
   responsive to a first edge of the clock signal, asynchronously loading first data into a first asynchronous shift register;
   wherein the first data includes first multiple sets of data for multiple operations;
   asynchronously unloading the first data from the first asynchronous shift register to a function block;
   processing the first data with the function block to provide second data;
   wherein the second data includes second multiple sets of data as results for the multiple operations;
   asynchronously loading the second data into a second asynchronous shift register; and
   responsive to a second edge of the clock signal, asynchronously unloading the second data from the second asynchronous shift register as the results of the multiple operations;
   wherein the first edge and the second edge of the clock signal are associated with a same period of the clock signal.

2. The method according to claim 1, further comprising:
   responsive to the first edge of the clock signal, asserting a first request signal by a synchronous-to-asynchronous converter to the first asynchronous shift register;
   wherein the asynchronously loading of the first data into the first asynchronous shift register is responsive to assertion of the first request signal.

3. The method according to claim 2, further comprising:
   sending a first acknowledgement signal from the first asynchronous shift register to the synchronous-to-asynchronous converter; and
   de-asserting the first request signal by the synchronous-to-asynchronous converter responsive to the first acknowledgement signal;
   wherein the asynchronously unloading of the first data is from the first asynchronous shift register to a function block responsive to de-assertion of the first request signal.

4. The method according to claim 3, further comprising:
   asserting an unload signal by an asynchronous-to-synchronous converter responsive to the second edge of the clock signal and a condition of the second asynchronous shift register; and
   asserting a second request signal by the second asynchronous shift register to the asynchronous-to-synchronous converter responsive to assertion of the unload signal.

5. The method according to claim 4, further comprising:
   sending a second acknowledgement signal by the asynchronous-to-synchronous converter to the second asynchronous shift register in response to the second request signal;
   wherein the asynchronously unloading by the second asynchronous shift register is in response to the second acknowledgement signal; and
   de-asserting the second request signal by the second asynchronous shift register responsive to the second acknowledgement signal.

6. The method according to claim 5, further comprising:
   clearing the unload signal by the second asynchronous shift register responsive to the second acknowledgement signal.

7. The method according to claim 1, further comprising for the first data being an initial set of data, adding at least one clock cycle of latency from the asynchronously loading of the first data to the asynchronously unloading of the second data.

8. The method according to claim 1, further comprising:
   entering a feedback mode; and
   feeding back the second data as the first data.

9. A method for asynchronous time multiplexing of information with synchronous interfacing; comprising:
   receiving a clock signal;
   responsive to a first edge of the clock signal, initiating a first request;
   loading multiple sets of inputs via an input data interface;
   acknowledging the loading;
   sequentially processing each of the multiple sets of inputs to provide respective sets of outputs;
   temporarily storing the sets of outputs;
   initiating a second request responsive to storage of the sets of outputs; and
   responsive to a second edge of the clock signal and the second request, unloading the sets of outputs via an output data interface;
   wherein the sequentially processing of the multiple sets of inputs is asynchronously time multiplexed; and
   wherein the input data interface and the output data interface appear synchronous with respect to the clock signal.

10. The method according to claim 9, wherein the input data interface and the output data interface are for parallel data input and parallel data output, respectively.

11. The method according to claim 10, further comprising:
    asynchronously shifting in the multiple sets of inputs with the loading as first parallel data;

asynchronously shifting out the multiple sets of inputs sequentially as M-bit wide first serial data for the sequentially processing thereof for M a positive integer greater than 1;

asynchronously shifting in the sets of outputs as Q-bit wide second serial data for the temporarily storing for Q a positive integer greater than 1; and asynchronously shifting out the sets of outputs for the unloading as second parallel data.

12. The method according to claim 10, wherein the unloading of the sets of outputs is delayed by at least one clock cycle of the clock signal.

13. The method according to claim 10, further comprising:
entering a feedback mode; and
feeding back the sets of outputs unloaded as the multiple sets of inputs for the loading anew.

14. A circuit for asynchronous time multiplexing with synchronous interfacing, comprising:
a synchronous-to-asynchronous converter to receive a clock signal to cause first parallel data to be loaded;
a first asynchronous shift register to shift in the first parallel data and to shift out first serial data therefrom;
a function block to process the first serial data to provide second serial data;
a second asynchronous shift register to shift in the second serial data and to shift out second parallel data therefrom; and
an asynchronous-to-synchronous converter to receive the clock signal to cause the second parallel data to be unloaded;
wherein asynchronous pipelining of the first serial data and the second serial data from the first asynchronous shift register to the second asynchronous shift register provides for asynchronously time multiplexing multiple operations associated with multiple sets of data of the first parallel data.

15. The circuit according to claim 14, wherein the first parallel data is loaded and the second parallel data is unloaded in synchronous operation with respect to the clock signal.

16. The circuit according to claim 15, further comprising:
a buffer coupled between the first asynchronous shift register and the second asynchronous shift register and further coupled between a first operator and a second operator of the function block;

a first delay coupled between the first asynchronous shift register and the buffer; and
a second delay coupled between the buffer and the second asynchronous shift register;
wherein a multistage asynchronous pipeline is provided.

17. The circuit according to claim 16, wherein:
the buffer is to receive interim data from the first operator for temporary storage and to provide the interim data to the second operator after being temporarily stored;
the first delay has a first delay associated with the first operator; and
the second delay has a second delay associated with the second operator.

18. The circuit according to claim 17, wherein the buffer, the first delay, and the second delay are coupled such that:
first request signaling goes from the first asynchronous shift register to the first delay and from the first delay to the buffer;
second request signaling goes from the buffer to the second delay and from the second delay to the second asynchronous shift register;
first acknowledge signaling goes from the second asynchronous shift register to the second delay and from the second delay to the buffer; and
second acknowledge signaling goes from the buffer to the first delay and from the first delay to the first asynchronous shift register.

19. The circuit according to claim 14, wherein:
the second asynchronous shift register has an output data interface coupled to an input data interface of the first asynchronous shift register for operation in a feedback mode; and
the asynchronous-to-synchronous converter is configured to provide a request signal to the first asynchronous shift register and the second asynchronous shift register for selecting between the feedback mode and a feed forward mode.

20. The circuit according to claim 14, wherein the asynchronous-to-synchronous converter is configured to add at least one clock cycle of the clock signal for latency on an initial set of data be processed.

* * * * *